(12) United States Patent
Yoon et al.

(10) Patent No.: US 7,667,314 B2
(45) Date of Patent: Feb. 23, 2010

(54) INTEGRATED CIRCUIT PACKAGE SYSTEM WITH MOLD LOCK SUBASSEMBLY

(75) Inventors: In Sang Yoon, Ichon-si (KR); Sungmin Song, Inchon (KR)

(73) Assignee: STATS ChipPAC Ltd., Singapore (SG)

( * ) Notice: Subject to any disclaimer, the term of this patent is extended or adjusted under 35 U.S.C. 154(b) by 8 days.

(21) Appl. No.: 11/865,064

(22) Filed: Sep. 30, 2007

(65) Prior Publication Data

US 2009/0085199 A1    Apr. 2, 2009

(51) Int. Cl.
*H01L 23/28* (2006.01)
(52) U.S. Cl. .............. 257/687; 257/686; 257/725; 257/E23.116; 438/109; 438/126; 438/127
(58) Field of Classification Search .......... 257/686, 257/687, 725, E23.116; 438/109, 126, 127
See application file for complete search history.

(56) References Cited

U.S. PATENT DOCUMENTS

| | | | |
|---|---|---|---|
| 5,468,681 A | 11/1995 | Pasch | |
| 5,770,889 A | 6/1998 | Rostoker et al. | |
| 5,889,652 A | 3/1999 | Turturro | |
| 6,444,921 B1 | 9/2002 | Wang et al. | |
| 6,841,858 B2 * | 1/2005 | Shim et al. | 257/676 |
| 7,309,913 B2 * | 12/2007 | Shim et al. | 257/686 |
| 2004/0061202 A1 * | 4/2004 | Shim et al. | 257/666 |
| 2006/0027902 A1 * | 2/2006 | Ararao et al. | 257/676 |
| 2006/0220256 A1 | 10/2006 | Shim et al. | |
| 2007/0194423 A1 * | 8/2007 | Yim et al. | 257/686 |

* cited by examiner

*Primary Examiner*—Victor A Mandala
(74) *Attorney, Agent, or Firm*—Mikio Ishimaru

(57) ABSTRACT

An integrated circuit package system includes: providing a substrate; attaching an integrated circuit over the substrate; attaching an integrated circuit subassembly system having a perforated interposer over the substrate with the perforated interposer having a slot; and forming a package encapsulation over the integrated circuit subassembly system, the perforated interposer, the integrated circuit, and the substrate with the slot filled with the package encapsulation.

20 Claims, 5 Drawing Sheets

INTEGRATED CIRCUIT PACKAGE SYSTEM WITH MOLD LOCK SUBASSEMBLY

TECHNICAL FIELD

The present invention relates generally to integrated circuit package system and more particularly to an integrated circuit package system having an encapsulation.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages, package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages with stacking configurations, or PIP, may also present problems. Spacer structures may be used to create space for electrical connections in the stacked structure. Package structures contain packaged integrated circuits in the stacked structures. Typical spacer structures and the encapsulation material of the packaged integrated circuits have low adhesion and become a source of delamination. Conventional spacer and packaged integrated circuits interface perform poorly in reliability test from the delamination at this interface.

Thus, a need still remains for an integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a substrate; attaching an integrated circuit over the substrate; attaching an integrated circuit subassembly system having a perforated interposer over the substrate with the perforated interposer having a slot; and forming a package encapsulation over the integrated circuit subassembly system, the perforated interposer, the integrated circuit, and the substrate with the slot filled with the package encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
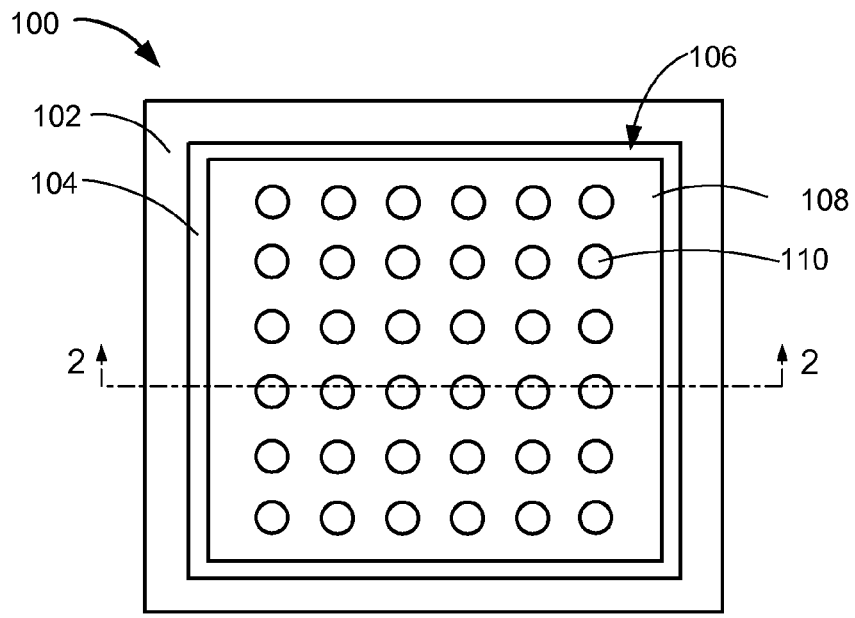
FIG. 1 is a top view of an integrated circuit package system in first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a package encapsulation 102, such as an epoxy mold compound, having an opening 104. The opening 104 exposes a portion of an integrated circuit subassembly system 106. The opening 104 exposes a carrier 108, such as a laminate substrate, having terminals 110, such as contact sites. The terminals 110 and the carrier 108 are part of the integrated circuit subassembly system 106.

Figure 2:
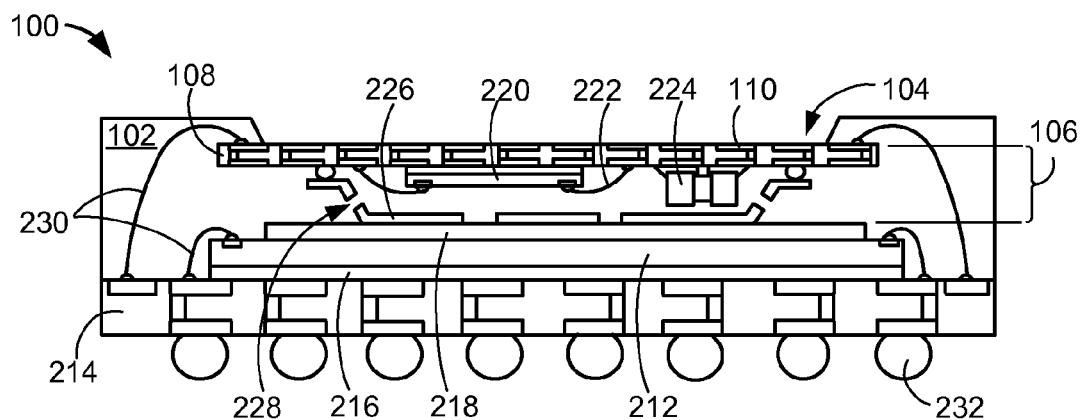
FIG. 2 is a cross-sectional view of the integrated circuit package system along 2-2 of FIG. 1.

Referring now to FIG. 2, therein is shown a cross-sectional view of the integrated circuit package system 100 along 2-2 of FIG. 1. The cross-sectional view depicts the integrated circuit package system 100 having a first integrated circuit 212, such as an integrated circuit die, over a package substrate 214, such as a laminate substrate, with a first adhesive 216, such as a die-attach adhesive. A second adhesive 218, such as a die attach adhesive, is between the first integrated circuit 212 and the integrated circuit subassembly system 106.

The integrated circuit subassembly system 106 is shown with a subassembly integrated circuit 220, such as an integrated circuit die, facing the first integrated circuit 212. Inner interconnects 222, such as bond wires or ribbon bond wires, connect the subassembly integrated circuit 220 and the carrier 108. A component device 224, such as a passive component, may be mounted to the carrier 108 adjacent to the subassembly integrated circuit 220.

For illustrative purposes, the integrated circuit package system 100 is shown with the first integrated circuit 212 and the subassembly integrated circuit 220 as a wire bond integrated circuit, although it is understood that the integrated circuit package system 100 may have different types of integrated circuits. For example, the first integrated circuit 212, the subassembly integrated circuit 220, or a combination thereof may be a flip chip.

A perforated interposer 226, having slots 228, covers the subassembly integrated circuit 220, the inner interconnects 222, and the component device 224 under a side of the carrier 108 having the subassembly integrated circuit 220.

First internal interconnects 230, such as bond wires, connect to a side of the carrier 108 exposed by the opening 104 and the package substrate 214. The first internal interconnects 230 also connect the first integrated circuit 212 and the package substrate 214. External interconnects 232, such as solder balls, connect to the package substrate 214 on a side opposite the first integrated circuit 212. The external interconnects 232 connect to the next system level (not shown), such as printed circuit board or another integrated circuit package system.

The package encapsulation 102 is over a side of the package substrate 214 having the first integrated circuit 212 thereover. The package encapsulation 102 covers the first integrated circuit 212, the first adhesive 216, the second adhesive 218, the first internal interconnects 230, and a portion of the integrated circuit subassembly system 106. The package encapsulation 102 fills the slots 228 in the perforated interposer 226 such that the perforated interposer 226 functions as a mold lock. The opening 104 in the package encapsulation 102 partially exposes the carrier 108 having the terminals 110.

Figure 3:
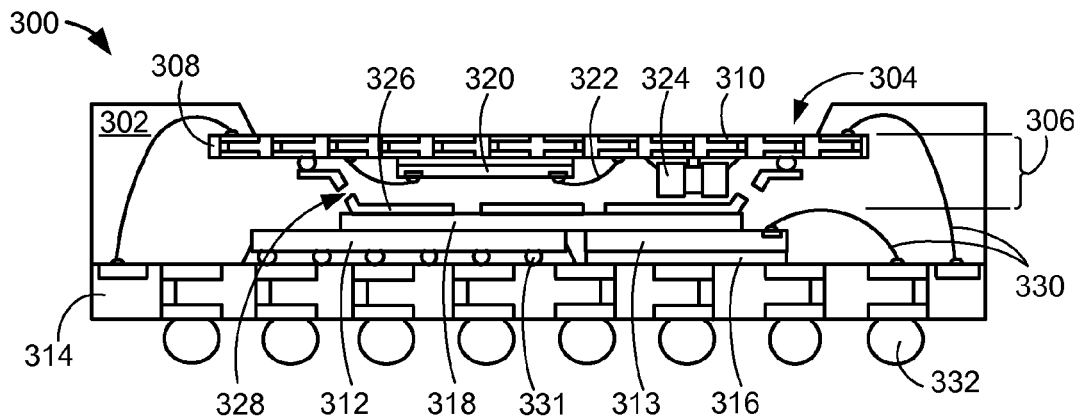
FIG. 3 is a cross-sectional view similar to FIG. 2 of an integrated circuit package system in a second embodiment of the present invention.

Referring now to FIG. 3, therein is shown a cross-sectional view similar to FIG. 2 of an integrated circuit package system 300 in a second embodiment of the present invention. The integrated circuit package system 300 includes structural similarities to the integrated circuit package system 100 of FIG. 2. The cross-sectional view depicts the integrated circuit package system 300 having a first integrated circuit 312, such as a flip chip, and a second integrated circuit 313, such as an integrated circuit die, over a package substrate 314, such as a laminate substrate. A first adhesive 316, such as a die-attach adhesive, is between the second integrated circuit 313 and the package substrate 314. A second adhesive 318, such as an adhesive film, is over the first integrated circuit 312 and the second integrated circuit 313.

An integrated circuit subassembly system 306 is over the first integrated circuit 312, the second integrated circuit 313, and the second adhesive 318. The integrated circuit subassembly system 306 is shown with a subassembly integrated circuit 320, such as an integrated circuit die, facing the first integrated circuit 312. Inner interconnects 322, such as bond wires or ribbon bond wires, connect the subassembly integrated circuit 320 and a carrier 308, such as a laminated substrate. A component device 324, such as a passive component, may be mounted to the carrier 308 adjacent to the subassembly integrated circuit 320.

For illustrative purposes, the integrated circuit package system 300 is shown with the second integrated circuit 313 and the subassembly integrated circuit 320 as a wire bond integrated circuit, although it is understood that the integrated circuit package system 300 may have different types of integrated circuits. For example, the second integrated circuit 313, the subassembly integrated circuit 320, or a combination thereof may be a flip chip.

A perforated interposer 326, having slots 328, covers the subassembly integrated circuit 320, the inner interconnects 322, and the component device 324 under a side of the carrier 308 having the subassembly integrated circuit 320.

First internal interconnects 330, such as bond wires, connect to a side of the carrier 308 exposed by an opening 304 and the package substrate 314. The first internal interconnects 330 also connect the second integrated circuit 313 and the package substrate 314. Second internal interconnects 331, such as solder bumps, connect the first integrated circuit 312 and the package substrate 314.

External interconnects 332, such as solder balls, connect to the package substrate 314 on a side opposite the first integrated circuit 312. The external interconnects 332 connect to the next system level (not shown), such as printed circuit board or another integrated circuit package system.

A package encapsulation 302, such as an epoxy molding compound, is over a side of the package substrate 314 having the first integrated circuit 312 thereover. The package encapsulation 302 covers the first integrated circuit 312, the second integrated circuit 313, the first adhesive 316, the second adhesive 318, the first internal interconnects 330, the second internal interconnects 331, and a portion of the integrated circuit subassembly system 306. The package encapsulation 302 fills the slots 328 in the perforated interposer 326 such that the perforated interposer 326 functions as a mold lock. The opening 304 in the package encapsulation 302 partially exposes the carrier 308 having terminals 310.

Figure 4:
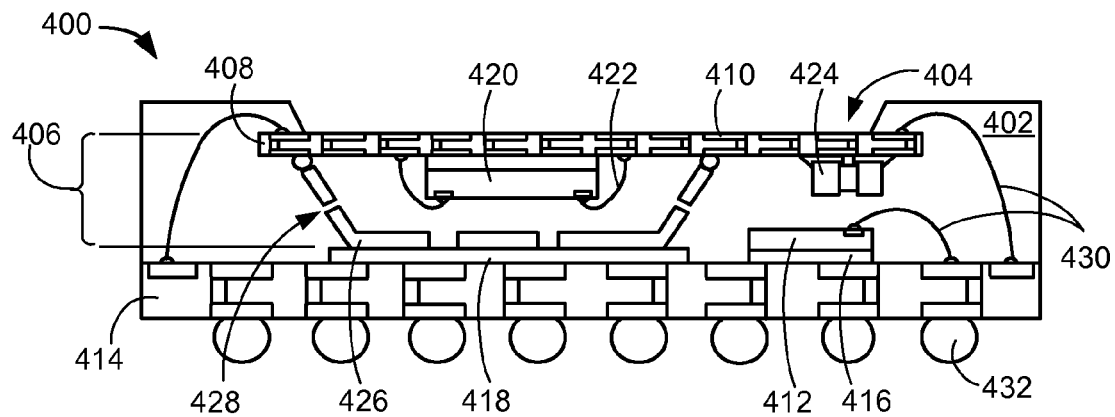
FIG. 4 is a cross-sectional view similar to FIG. 2 of an integrated circuit package system in a third embodiment of the present invention.

Referring now to FIG. 4, therein is shown a cross-sectional view similar to FIG. 2 of an integrated circuit package system 400 in a third embodiment of the present invention. The integrated circuit package system 400 includes structural similarities to the integrated circuit package system 100 of FIG. 2.

The cross-sectional view depicts the integrated circuit package system 400 having a first integrated circuit 412, such as an integrated circuit die, over a package substrate 414, such as a laminate substrate. A first adhesive 416, such as a die-attach adhesive, is between the first integrated circuit 412 and the package substrate 414.

An integrated circuit subassembly system 406 is over the package substrate 414 and the first integrated circuit 412. A second adhesive 418, such as an adhesive film or a dispensed adhesive, is between the integrated circuit subassembly system 406 and the package substrate 414. The integrated circuit subassembly system 406 is shown with a subassembly integrated circuit 420, such as an integrated circuit die, facing the package substrate 414. Inner interconnects 422, such as bond wires or ribbon bond wires, connect the subassembly integrated circuit 420 and a carrier 408, such as a laminated substrate. A component device 424, such as a passive component, may be mounted to the carrier 408 adjacent to the subassembly integrated circuit 420.

For illustrative purposes, the integrated circuit package system 400 is shown with the first integrated circuit 412 and the subassembly integrated circuit 420 as a wire bond integrated circuit, although it is understood that the integrated circuit package system 400 may have different types of integrated circuits. For example, the first integrated circuit 412, the subassembly integrated circuit 420, or a combination thereof may be a flip chip.

A perforated interposer 426, having slots 428, covers the subassembly integrated circuit 420 and the inner interconnects 422 under a side of the carrier 408 having the subassembly integrated circuit 420. The component device 424 is adjacent to the perforated interposer 426. The perforated interposer 426 is adjacent to the first integrated circuit 412.

First internal interconnects 430, such as bond wires, connect to a side of the carrier 408 exposed by an opening 404 and the package substrate 414. The first internal interconnects 430 also connect the first integrated circuit 412 and the package substrate 414.

External interconnects 432, such as solder balls, connect to the package substrate 414 on a side opposite the first integrated circuit 412. The external interconnects 432 connect to the next system level (not shown), such as printed circuit board or another integrated circuit package system.

A package encapsulation 402, such as an epoxy molding compound, is over a side of the package substrate 414 having the first integrated circuit 412 thereover. The package encapsulation 402 covers the first integrated circuit 412, the first adhesive 416, the second adhesive 418, the first internal interconnects 430, and a portion of the integrated circuit subassembly system 406. The package encapsulation 402 fills the slots 428 in the perforated interposer 426 such that the perforated interposer 426 functions as a mold lock. The opening 404 in the package encapsulation 402 partially exposes the carrier 408 having terminals 410.

Figure 5:
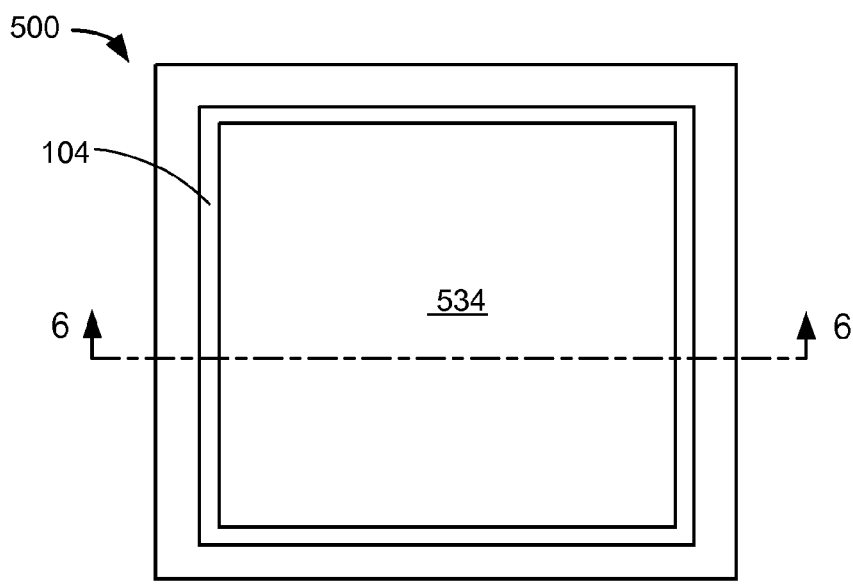
FIG. 5 is a top view of an integrated circuit package-on-package system in an application with the integrated circuit package system of FIG. 2 in a fourth embodiment of the present invention.

Referring now to FIG. 5, therein is shown a top view of an integrated circuit package-on-package system 500 in an application with the integrated circuit package system 100 of FIG. 2 in a fourth embodiment of the present invention. The integrated circuit package-on-package system 500 may be formed with other embodiments of the present inventions, such as the integrated circuit package system 300 of FIG. 3 or the integrated circuit package system 400 of FIG. 4. A mounting integrated circuit device 534, such as a packaged integrated circuit, mounts into the opening 104 over the integrated circuit package system 100.

Figure 6:
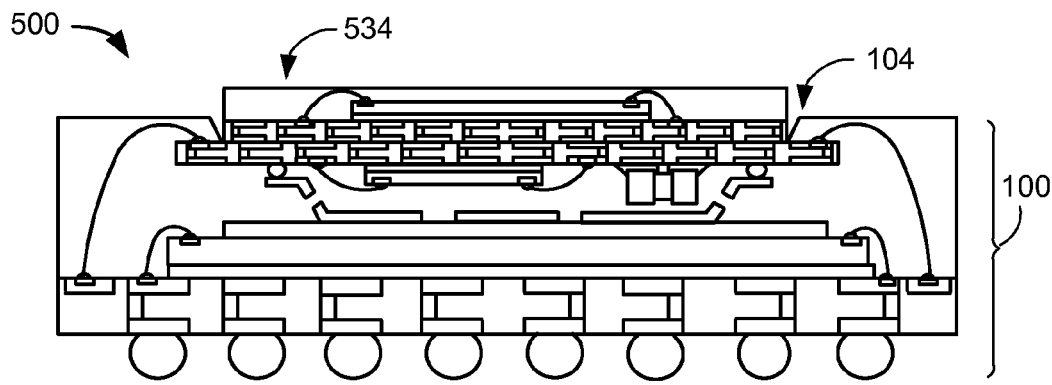
FIG. 6 is a cross-sectional view of the integrated circuit package-on-package system along 6-6 of FIG. 5.

Referring now to FIG. 6, therein is shown a cross-sectional view of the integrated circuit package-on-package system 500 along 6-6 of FIG. 5. The mounting integrated circuit device 534, such as a packaged integrated circuit, mounts into the opening 104 over the integrated circuit package system 100. For illustrative purposes, the integrated circuit package-on-package system 500 is shown with the mounting integrated circuit device 534 as a packaged integrated circuit having a substrate, although it is understood that the integrated circuit package-on-package system 500 may be formed with different types of integrated circuit for the mounting integrated circuit device 534. For example, the mounting integrated circuit device 534 may include multiple integrated circuits, a quad flat nonleaded (QFN) device, a quad flat package (QFP) device, a bump chip carrier (BCC) device, a flip chip, a passive component, or a combination thereof.

Figure 7:
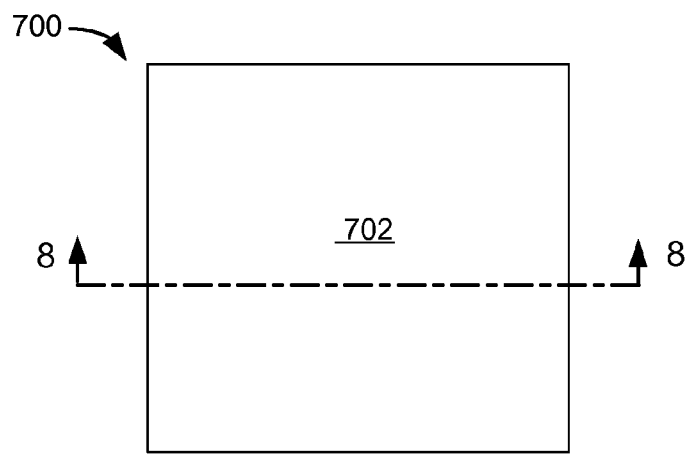
FIG. 7 is a top view of an integrated circuit package-in-package system in a fifth embodiment of the present invention.

Referring now to FIG. 7, therein is shown a top view of an integrated circuit package-in-package system 700 in a fifth embodiment of the present invention. The top view depicts a package encapsulation 702, such as an epoxy molding compound, of the integrated circuit package-in-package system 700.

Figure 8:
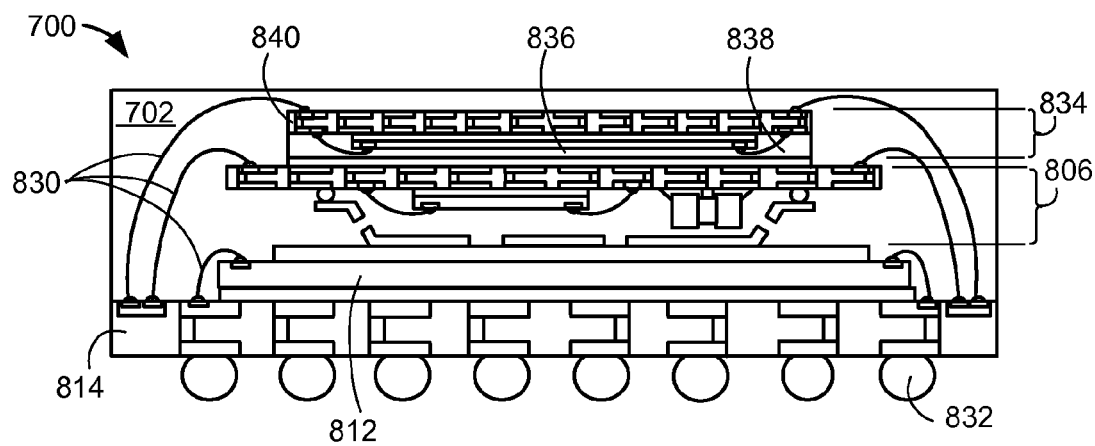
FIG. 8 is a cross-sectional view of the integrated circuit package-in-package system along 8-8 of FIG. 7.

Referring now to FIG. 8, therein is shown a cross-sectional view of the integrated circuit package-in-package system 700 along 8-8 of FIG. 7. The integrated circuit package-in-package system 700 includes structural similarities to the integrated circuit package-on-package system 500 of FIG. 6.

The integrated circuit package-in-package system 700 includes a first integrated circuit 812 over a package substrate 814 and an integrated circuit subassembly system 806 over the first integrated circuit 812. As example, the first integrated circuit 812, the package substrate 814, and the integrated circuit subassembly system 806 and the relationships with each other are similar to same named elements in FIG. 2. First internal interconnects 830 connect the first integrated circuit 812 and the package substrate 814. The first internal interconnects 830 also connect the integrated circuit subassembly system 806 and the package substrate 814.

A mounting integrated circuit device 834 is over the integrated circuit subassembly system 806. A mounting adhesive 836 is between the integrated circuit subassembly system 806 and an inner encapsulation 838 of the mounting integrated circuit device 834. The first internal interconnects 830 also connect an inner substrate 840 of the mounting integrated circuit device 834 and the package substrate 814.

The package encapsulation 702, such as an epoxy molding compound, covers the first integrated circuit 812, the integrated circuit subassembly system 806, the mounting integrated circuit device 834, and the first internal interconnects 830 over the package substrate 814. External interconnects 832, such as solder balls, connect to an underside of the package substrate 814.

Figure 9:
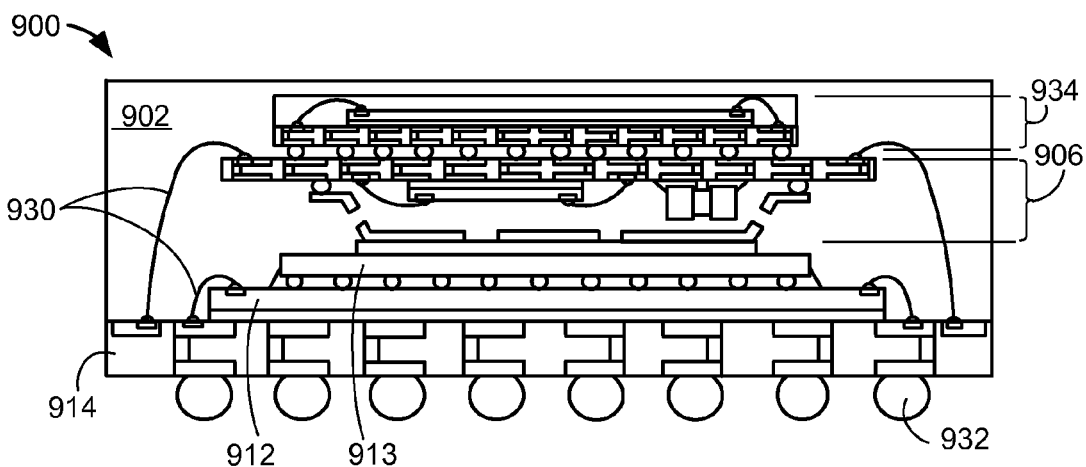
FIG. 9 is a cross-sectional view similar to FIG. 8 of an integrated circuit package-in-package system in a sixth embodiment of the present invention.

Referring now to FIG. 9, therein is shown a cross-sectional view similar to FIG. 8 of an integrated circuit package-in-package system 900 in a sixth embodiment of the present invention. The integrated circuit package-in-package system 900 includes structural similarities to the integrated circuit package-on-package system 500 of FIG. 6.

The integrated circuit package-in-package system 900 includes a first integrated circuit 912, such as an integrated circuit die, over a package substrate 914. A second integrated circuit 913, such as a flip chip, may be over the first integrated circuit 912. An integrated circuit subassembly system 906 may be over the first integrated circuit 912. As example, the integrated circuit subassembly system 906 includes structural similarities to same named element in FIG. 9. First internal interconnects 930 connect the first integrated circuit 912 and the package substrate 914. The first internal interconnects 930 also connect the integrated circuit subassembly system 906 and the package substrate 914. A mounting integrated circuit device 934 may be over the integrated circuit subassembly system 906 and electrically connects with the integrated circuit subassembly system 906.

A package encapsulation 902, such as an epoxy molding compound, covers the first integrated circuit 912, the integrated circuit subassembly system 906, the mounting integrated circuit device 934, and the first internal interconnects 930 over the package substrate 914. External interconnects 932, such as solder balls, connect to an underside of the package substrate 914.

Figure 10:
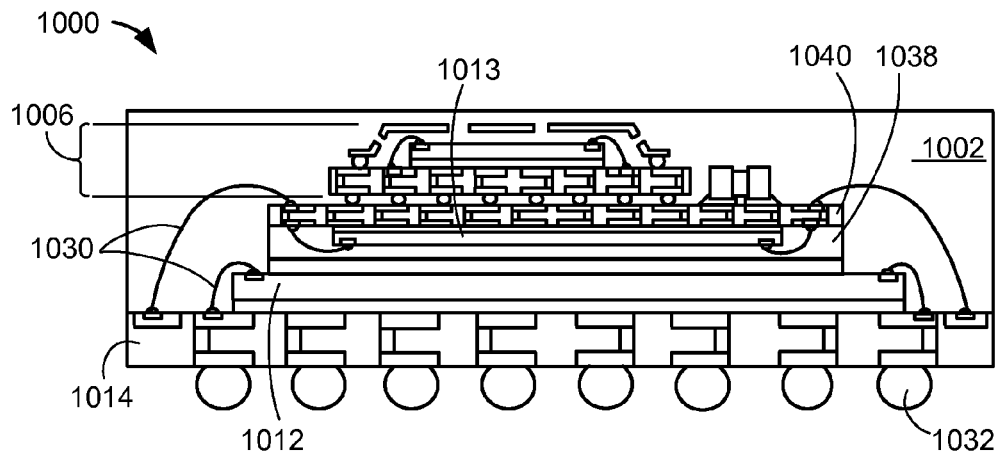
FIG. 10 is a cross-sectional view similar to FIG. 8 of an integrated circuit package-in-package system in a seventh embodiment of the present invention.

Referring now to FIG. 10, therein is shown a cross-sectional view similar to FIG. 8 of an integrated circuit package-in-package system 1000 in a seventh embodiment of the present invention. The integrated circuit package-in-package system 1000 includes a first integrated circuit 1012, such as an integrated circuit die, over a package substrate 1014. A second integrated circuit 1013, such as a packaged integrated circuit, may be over the first integrated circuit 1012. An inner encapsulation 1038 of the second integrated circuit 1013 may be facing the first integrated circuit 1012. An inner substrate 1040, such as a laminated substrate, may face away from the first integrated circuit 1012.

An integrated circuit subassembly system 1006 may be mounted over and connected with the second integrated circuit 1013. As example, the integrated circuit subassembly system 1006 includes structural similarities to same named element in FIG. 4. First internal interconnects 1030 connect the first integrated circuit 1012 and the package substrate 1014. The first internal interconnects 1030 also connect the second integrated circuit 1013 and the package substrate 1014.

A package encapsulation 1002, such as an epoxy molding compound, covers the first integrated circuit 1012, the integrated circuit subassembly system 1006, the second integrated circuit 1013, and the first internal interconnects 1030 over the package substrate 1014. External interconnects 1032, such as solder balls, connect to an underside of the package substrate 1014.

Figure 11:
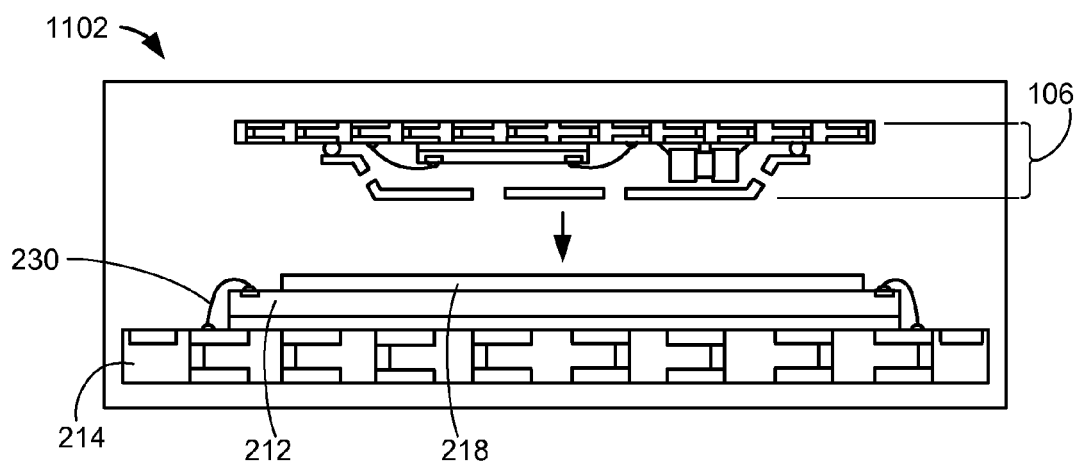
FIG. 11 is a cross-sectional view of an intermediate structure in a mounting step of an embodiment of the present invention.

Referring now to FIG. 11, therein is shown a cross-sectional view of an intermediate structure 1102 in a mounting step of an embodiment of the present invention. The intermediate structure 1102 depicts portions of the integrated circuit package system 100 of FIG. 2 including the first integrated circuit 212 mounted over the package substrate 214. The first internal interconnects 230 connect the first integrated circuit 212 and the package substrate 214. The second adhesive 218 is over the first integrated circuit 212. The integrated circuit subassembly system 106 is shown above the first integrated circuit 212 with an arrow depicting the mounting direction of the integrated circuit subassembly system 106.

Figure 12:
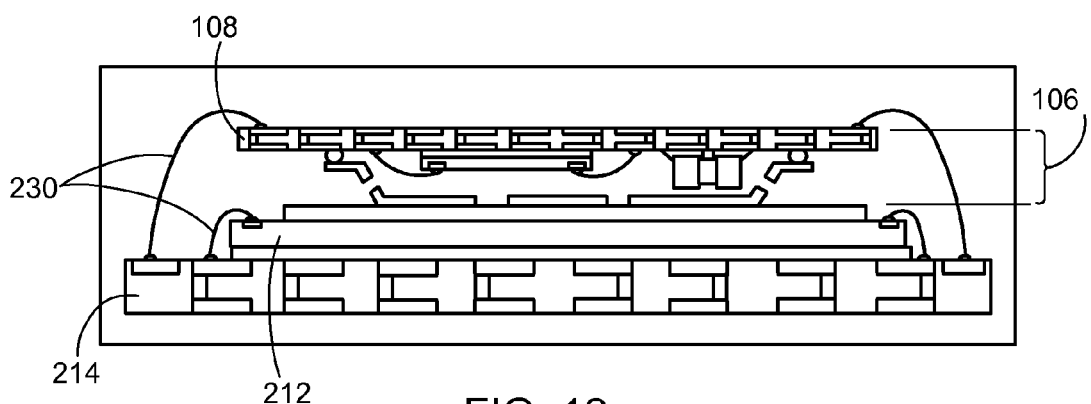
FIG. 12 is the structure of FIG. 11 in a connecting step.

Referring now to FIG. 12, therein is shown the structure of FIG. 11 in a connecting step. The integrated circuit subassembly system 106 is mounted over the first integrated circuit 212 and the package substrate 214. The first internal interconnects 230 connect the carrier 108 of the integrated circuit subassembly system 106 and the package substrate 214. For illustrative purposes, the first internal interconnects 230 are described connecting the package substrate 214 to both the first integrated circuit 212 and the carrier 108, although it is understood that the package substrate 214 may connect to the first integrated circuit and the carrier 108 with different interconnect types, such as reverse stand-off stitch bonds (RSSB) versus bond wires.

Figure 13:
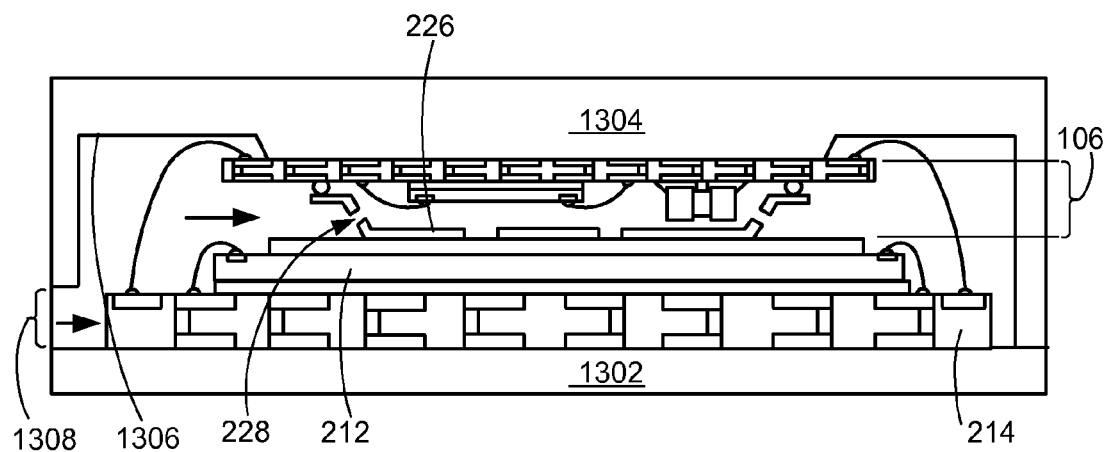
FIG. 13 is the structure of FIG. 12 in a molding step.

Referring now to FIG. 13, therein is shown the structure of FIG. 12 in a molding step. The structure of FIG. 2 undergoes a molding step and placed between a bottom chase 1302 and a top chase 1304. The top chase 1304 includes an interior contour 1306 that complements the package encapsulation 102 of FIG. 2 and the opening 104 of FIG. 2.

A flow channel 1308 between an end of the bottom chase 1302 and the top chase 1304 provides flow of the molding compound for forming the package encapsulation 102. The slots 228 in the perforated interposer 226 allows for a single step modeling process of the integrated circuit subassembly system 106 with the first integrated circuit 212 and the package substrate 214. After filling the space between the bottom chase 1302 and the top chase 1304, the encapsulated structure may undergo post mold cure, cleaning, and attachment of the external interconnects 232 of FIG. 2 for forming the integrated circuit package system 100 of FIG. 2.

Figure 14:
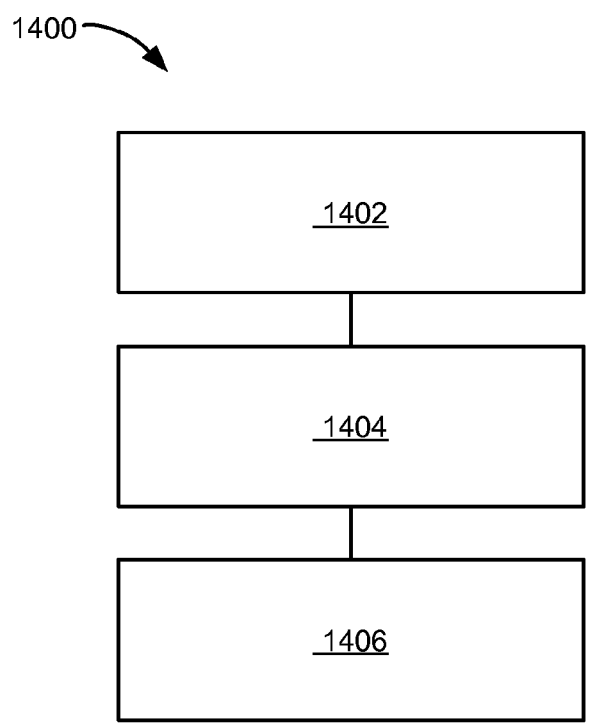
FIG. 14 is a flow chart of an integrated circuit package system for manufacture of the integrated circuit package system in an embodiment of the present invention.

Referring now to FIG. 14, therein is shown a flow chart of an integrated circuit package system 1400 for manufacture of the integrated circuit package system 100 in an embodiment of the present invention. The system 1400 includes providing a substrate in a block 1402; attaching an integrated circuit over the substrate in a block 1404; attaching an integrated circuit subassembly system having a perforated interposer over the substrate with the perforated interposer having a slot in a block 1406; and forming a package encapsulation over the integrated circuit subassembly system, the perforated interposer, the integrated circuit, and the substrate with the slot filled with the package encapsulation in a block 1408.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
providing a substrate;
attaching an integrated circuit over the substrate;
attaching an integrated circuit subassembly system having a perforated interposer over the substrate with the perforated interposer having a slot; and
forming a package encapsulation over the integrated circuit subassembly system, the perforated interposer, the integrated circuit, and the substrate with the slot filled with the package encapsulation.

2. The system as claimed in claim 1 wherein attaching the integrated circuit subassembly system includes attaching a subsystem integrated circuit.

3. The system as claimed in claim 1 wherein attaching the integrated circuit subassembly system includes attaching the perforated interposer over the integrated circuit.

4. The system as claimed in claim 1 wherein attaching the integrated circuit includes attaching a wire bond integrated circuit.

5. The system as claimed in claim 1 wherein attaching the integrated circuit includes attaching a flip chip.

6. An integrated circuit package system comprising:
providing a package substrate;
attaching a first integrated circuit over the package substrate with a first adhesive;
attaching an integrated circuit subassembly system having a perforated interposer, a subassembly integrated circuit, and a carrier over the package substrate with the perforated interposer having a slot; and
forming a package encapsulation over the carrier, the subassembly integrated circuit, the perforated interposer, the first integrated circuit, and the package substrate with the slot filled with the package encapsulation.

7. The system as claimed in claim 6 wherein attaching the integrated circuit subassembly system includes attaching the carrier over the first integrated circuit.

8. The system as claimed in claim 6 further comprising attaching a component device to the carrier.

9. The system as claimed in claim 6 wherein attaching the integrated circuit subassembly system includes attaching a mounting integrated circuit device over the integrated circuit subassembly system.

10. The system as claimed in claim 6 further comprising attaching a mounting integrated circuit device adjacent the package encapsulation over the integrated circuit subassembly system.

11. An integrated circuit package system comprising:
a substrate;
an integrated circuit over the substrate;
an integrated circuit subassembly system having a perforated interposer over the substrate with the perforated interposer having a slot; and
a package encapsulation over the integrated circuit subassembly system, the perforated interposer, the integrated circuit, and the substrate with the slot filled with the package encapsulation.

12. The system as claimed in claim 11 wherein the integrated circuit subassembly system includes a subsystem integrated circuit.

13. The system as claimed in claim 11 wherein the integrated circuit subassembly system includes the perforated interposer over the integrated circuit.

14. The system as claimed in claim 11 wherein the integrated circuit is a wire bond integrated circuit.

15. The system as claimed in claim 11 wherein the integrated circuit is a flip chip.

16. The system as claimed in claim 11 wherein:
the substrate is a package substrate;
the integrated circuit is a first integrated circuit over the package substrate with a first adhesive;
the integrated circuit subassembly system is an integrated circuit subassembly system having a perforated interposer, a subassembly integrated circuit, and a carrier over the substrate; and
the package encapsulation is over the carrier, the subassembly integrated circuit, the perforated interposer, the first integrated circuit, and the package substrate.

17. The system as claimed in claim 16 wherein the integrated circuit subassembly system includes the carrier over the first integrated circuit.

18. The system as claimed in claim 16 wherein the integrated circuit subassembly system includes a component device over the carrier.

19. The system as claimed in claim 16 wherein the integrated circuit subassembly system includes a mounting integrated circuit device over the integrated circuit subassembly system.

20. The system as claimed in claim 16 further comprising a mounting integrated circuit device adjacent the package encapsulation over the integrated circuit subassembly system.

* * * * *